United States Patent [19]

Budinger

[11] Patent Number: 4,512,113
[45] Date of Patent: Apr. 23, 1985

[54] WORKPIECE HOLDER FOR POLISHING OPERATION

[76] Inventor: William D. Budinger, 16 Southridge Rd., Kennett Square, Pa. 19348

[21] Appl. No.: 422,124
[22] Filed: Sep. 23, 1982
[51] Int. Cl.³ .............................................. B24B 4/04
[52] U.S. Cl. .................................. 51/236; 51/131.5; 51/129; 51/216 LP
[58] Field of Search .................... 51/129, 131.1–131.5, 51/236, 237, 216 LP, 283–284; 156/62.2, 77, 153, 154, 230, 236

[56] References Cited

U.S. PATENT DOCUMENTS

| 3,449,870 | 6/1969 | Jensen | 51/131.4 |
| 3,453,783 | 7/1969 | Queen | 51/131.2 |
| 3,924,361 | 12/1975 | White et al. | 51/283 |
| 4,081,928 | 4/1978 | Kinnebren et al. | 51/131.4 |
| 4,132,037 | 1/1979 | Bonora | 51/216 LP |
| 4,221,083 | 9/1980 | Carroll | 51/216 LP |

FOREIGN PATENT DOCUMENTS 27195 of 1975 Japan.
85588 of 1976 Japan.

Primary Examiner—Harold D. Whitehead
Attorney, Agent, or Firm—Panitch Schwarze Jacobs & Nadel

[57] ABSTRACT

The workholder includes a carrier to which a flat perforated template is removably secured. An insert is removably mounted in each hole and removably supports a silicon wafer to facilitate polishing the wafer.

7 Claims, 2 Drawing Figures

U.S. Patent  Apr. 23, 1985  4,512,113
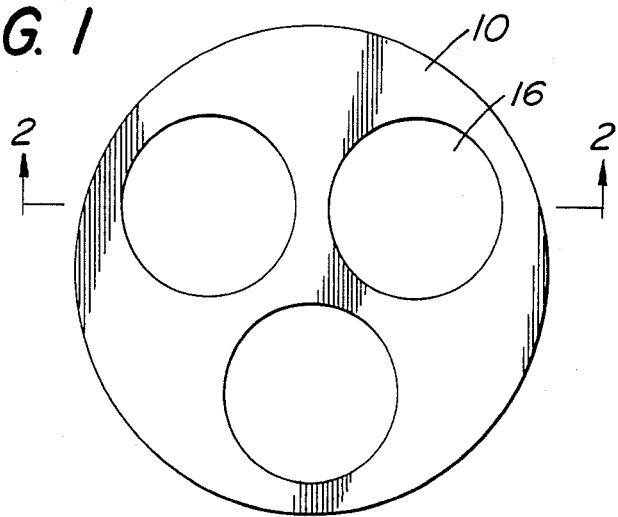
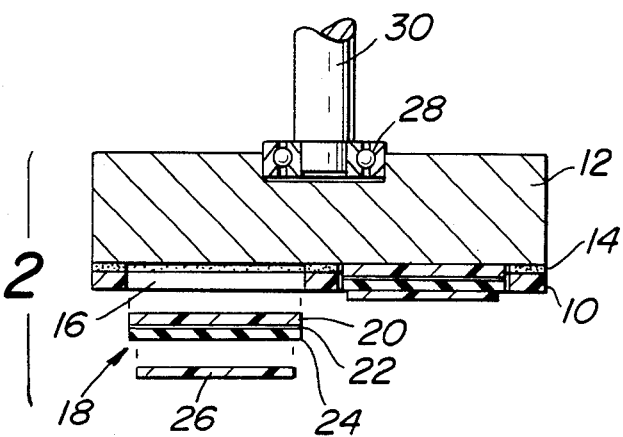

WORKPIECE HOLDER FOR POLISHING OPERATION

BACKGROUND OF THE INVENTION

The traditional means of securing flat workpieces to a lapping or polishing carrier has been with some sort of adhesive. One method in common use for example, spin coats a very fine layer of wax solution onto the carrier surface. When the solvent evaporates, a thin film of wax is left behind with a very flat surface. Workpieces or wafers positioned on the wax surface and heated develop sufficient bond to hold them in place without distorting the flat reference plane formed by the wax. Although this method is better than most other adhesive systems in producing flat parts, it shares the drawbacks of difficult clean-up, extreme sensitivity to operator skill, and no tolerance for dirt, dust or contamination.

Many improvements over the wax-mount process are currently in use. Most involve covering the carrier with some kind of material which tends to adhere to the back side of the workpiece. These materials tend to fall into two classifications: those that adhere as a result of surface tack, and those that are spongy and adhere as a result of capillary action or suction. An example of such systems are described in U.S. Pat. Nos. 3,449,870 and 4,132,037. The system described in U.S. Pat. No. 3,449,870 provides some additional protection and security for the workpiece by surrounding it with a retaining fence. The fence is deemed necessary to hold wafers in place that might otherwise slip out from under the carrier.

Waxless mounting systems such as those described in said patents have offered significant improvement in both convenience of operation and clean up. This improvement, however, has been gained at the expense of flatness in the finished parts. As industry, particularly electronics, develops needs for ever flatter parts, the difficulties inherent in all the above systems will make them inadequate.

The primary cause for poor flatness with "waxless" systems is the lack of perfection in the backing or fixturing material. The electronics industry is currently considering specifications for wafer substrates and masks that will require pieces 150 mm in diameter to be flat within one micron. To produce such flatness in a lapped part would normally require the part to be fixtured against a reference surface no less flat. The fixturing materials used for waxless mounting cannot economically or practically be produced with that degree of precision. The lack of precision in these mounting materials can be to some extent compensated for by softness or compressibility in the materials. However, when a plurality of wafers is mounted on a single carrier using a soft or compressible fixturing material, wave effects are set in motion which seriously degrade flatness in the finished parts. Further, if the wafers remain in fixed position, inconsistencies in the mounting material will be reflected through to the detriment of overall flatness.

This invention is directed to a solution of the above problems including providing a means for independently fixturing flat pieces of silicon, glass or other planar materials in order to achieve economically the flattest possible surface during grinding, lapping or polishing operations on said pieces.

SUMMARY OF THE INVENTION

The present invention is directed to a workpiece holder for polishing, lapping and grinding operations. The holder includes a rotatable carrier to which one face of a flat template is releasably secured. The template has a plurality of holes therethrough. The holes cooperate with the juxtaposed face of the carrier to define cavities. An insert is releasably positioned in each cavity. Each insert is a laminate to which a wafer to be processed is removably attached. The combined thickness of the laminate and wafer exceeds the thickness of the template.

It is an object of this invention to fixture wafers in such a manner that they are free and independent of other wafers on the same carrier.

It is a further object of this invention to allow wafers to float with relative freedom in their individual cavities and thus become independent of inconsistencies and imperfections in fixturing materials.

It is still another object of this invention to permit the easy and inexpensive replacement of wafer backing material without requiring replacement of the expensive template assembly.

It is further an object of this invention to provide the flatness attainable using a wax mount system without requiring that each workpiece be mounted each time with wax.

Finally, it is an object of this invention to provide an economical, forgiving fixturing system that will produce levels of flatness in the finished product that are orders of magnitude superior to the flatness or consistency of the backing materials used.

Other objects and advantages will appear hereinafter.

For the purpose of illustrating the invention, there is shown in the drawings a form which is presently preferred; it being understood, however, that this invention is not limited to the precise arrangements and instrumentalities shown.

FIG. 1 is a bottom plan view of a workpiece holder in accordance with this invention.

FIG. 2 is a sectional view taken along the line 2—2 in FIG. 1.

DETAILED DESCRIPTION

Referring to the drawing in detail, wherein like numerals indicate like elements. There is snown a flat template 10 releasably secured to one face of a carrier 12 by an adhesive layer 14. Template 10 has a plurality of equally spaced holes 16 extending therethrough. Each hole 16 cooperates with the juxtaposed face of carrier 12 to define a cavity. Each cavity is free of adhesive layer 14.

An identical insert 18 is provided for each cavity. Each insert 18 includes a backing material 20 bonded to a fixturing material 24 by adhesive layer 22. A workpiece 26 is releasably adhered to fixturing material 24. The combined thickness of insert 18 and workpiece 26 exceeds the thickness of template 10 and adhesive layer 14. Thus, the workpiece 26 protrudes beyond the adjacent exposed major face of template 10. See FIG. 2. Carrier 12 is adapted to rotate around bearing 28 on spindle 30.

EXAMPLE ONE

A fixturing assembly to hold three inserts 18 each 3 inches in diameter and 0.020 inches thick was constructed and secured to a circular carrier 12 which was 8 inches (20 cm) in diameter. The carrier 12 was constructed of cast iron which had been lapped flat to within 0.5 microns and then flash chrome plated to harden the surface and prevent corrosion.

A template 10 was prepared from a 0.050 inch thick sheet of fiberglass reinforced epoxy, commonly known as G-10. Into a 8 inch diameter disc of G-10, three holes 16 were machined, each 3.050±0.005 inches in diameter. The three holes 16 were machined so as to be equally spaced around the periphery of the template 10. Although the holes 16 can be punched or cut with a laser, it has been found that the edge formed by machining holds parts more securely during polishing.

The template 10 was secured to the carrier 12 by means of a suitable adhesive layer 14. A hot melt phenolic such as 3M Company's No. 583 works well and has the advantage that it may be easily softened and removed with heat or acetone when it becomes necessary to replace the template. It has been found that template wear varies greatly depending on run conditions, but it is not uncommon to require replacement in less than 1000 runs. In securing the template 10 to the carrier 12, it is important that no adhesive of layer 14 remain on the carrier 12 in the cavity areas formed by the holes 16 in the template 10.

Finally, the inserts 18 were prepared. Discs of G-10 were machined to exactly 3.025 inches in diameter and lapped flat to 0.020 inch nominal thickness to form backing material 20. To one surface of such disc was bonded a fixturing material 24 in the form of a film of soft silicone rubber 0.015 inch thick. The rubber film is sufficiently tacky so that at temperatures below 80° C. it will adhere securely to the workpiece 26 to be polished. At temperatures above 100° C. the tack diminishes sufficiently so that workpiece may be easily removed.

The workpiece holder of this example was used to polish a workpiece 26 in the form of a silicon wafer destined to become a substrate for integrated circuits. After the wafers were sawed, lapped and etched, they were ready for polishing. Three wafers of approximately identical 0.020 inch thickness were selected. Each one was bonded to an insert 18 by pressing it against the fixturing material 24 for thirty seconds in a press at 15° C. under 8 pounds per square inch pressure. After pressing, the insert 18 with wafer workpiece 26 was dropped into the pre-wetted cavities in the template 10. Surface tension from the moisture in the cavities holds the wafer+inserts in place while the carrier 12 was inverted and attached to the spindle 30 of a polishing machine. Polishing then proceeded in the conventional manner.

After polishing, the wafer+inserts were removed from their cavities by means of a small jet of air. Alternatively, a small pin type plunger can be built into the carrier 12 behind each cavity for the purposes of ejecting the insert. Wafers were then easily separated from their insert 18 by dropping the wafer insert into hot water and inserting a small blade between the silicon rubber fixturing material 24 and the wafer.

Each insert 18 was free to rotate within its cavity. The material used for the backing of the insert 18 exhibits a coefficient of friction against the chromed carrier that is lower than that of the workpiece 26 against the fixturing material 24. During the lapping or polishing operation, the workpiece 26 and insert 18 tended to rotate as a unit within its cavity.

Wafers polished by the method of this example were easily cleaned and exhibited good flatness characteristics.

EXAMPLE TWO

In an effort to improve flatness even more, the 0.010 mil G-10 backing material 20 was replaced by a thicker, dimensionally stable ceramic that had been lapped ultra flat. Wafers polished on these stable inserts exhibited little improvement in flatness over example 1.

EXAMPLE THREE

In the system of Example 1, the silicone rubber film of fixturing material 24 was replaced by a highly plasticized vinyl layer. This material was used in the same manner as the silicone rubber film except that the wafers were pressed on the inserts at 120° C. and removed at 10° C. Wafers produced in this example were somewhat flatter than those produced by Example 1. It is believed that the heat developed in polishing allowed the vinyl layer to flow more than the silicone rubber film and thus exert less of its own irregularities (that is to say it became more neutral in its effect on flatness).

EXAMPLE FOUR

In order to further improve the neutrality of the insert, the fixturing material 24 (silicone rubber or vinyl) was replaced by a thin sheet of volume compressible material. A sheet of film made according to U.S. Pat. No. 3,483,015 was split to 0.015 inches in thickness and bonded using 3M's 583 adhesive to the G-10 backing material 20. The rest of the system was prepared as in Example 1.

Wafers polished while fixtured according to this example exhibited substantially improved flatness over those of the preceding examples.

On some types of polishing or lapping machines, it may be desirable to provide a means to insure that the insert 18 remains in the cavity when the carrier 12 is lifted. One method is to place a small quantity of tenacious, high viscosity liquid between the back of the insert 18 and the carrier 12. High molecular weight glycols have been tried as well as low molecular weight elastomers. If the friction between the workpiece 26 and the face of the insert 18 allows the workpiece to move or rotate in relation to the insert, then it may not be necessary that the insert itself rotate in the cavity.

EXAMPLE FIVE

In this example, the insert 18 was bonded temporarily to the exposed surface of carrier 12 at the back of the cavity. Although pressure sensitive adhesives were tried, the following example gave superior results.

A template 10 was, lapped to 0.030 inches, machined, and mounted to the carrier 12 as in Example 1. The carrier 12 was then placed into an oven, template side up and heated to a temperature of 150° C. Exactly one gram of Pentalyn C resin containing 20% Polypropylene Glycol was placed in the center of each cavity and allowed to melt. Into each cavity was then placed a 3.025 inch diameter insert 18 in the form of a disc of film as used in Example 4 but without the G-10 backing material. On top of each film disc was then placed a ground ultraflat silicon wafer 3 inches in diameter and 0.020 inches thick. The entire assembly while still warm with wax molten was then placed in a press and cooled to 20° C. The press pressure was adjusted to give a total down force of 50 pounds. After 5 minutes the assembly was removed from the press and the wafers were removed from their cavities.

The film discs were now securely affixed to the back of each cavity. The ultraflat surface of the wafer impressed against the film had caused the wax to flow and fill irregularities between carrier 12 and the insert. The film was then dampened with water, wafers reinserted and polished as above. It was found that after about 20 to 25 runs the film became sufficiently worn or contaminated that is began to degrade the flatness of the polishing product. At this point the discs were easily replaced by reheating the carrier to 150° C., a temperature sufficient to melt the wax, but not the adhesive holding the template 10 to carrier 12. New film discs were inserted in the same manner as originally. A significant advantage of this example proved to be that in the wax bonding of the inserts to the carrier, the ultraflat wafer workpiece used to press the inserts in place caused the wax and film to flow into a "seat" that compensated for imperfections in the components. Wafers fixtured according to this example were extremely flat.

It was particularly noticed that the flattest wafers were adhieved when the film discs were mounted to the back of the cavity using ultraflat blanks to seat the film inserts under a pressure approximately equal to the expected polishing or lapping pressure on the workpiece. During such mounting process, the film is compressed at it is in service. Thus when the wax flows, it distributes itself between the film and carrier in such manner as to neutralize irregularities and cause the film to exert a uniform pressure throughout and over all the area of the blank. After the wax hardens and a workpiece mounted, the workpiece will seek a condition that equalizes pressure. sure. That condition will be reached only when the workpiece has achieved the same flatness as the mounting blank.

It is found during the course of investigation that many other materials could be substituted for G-10 as the insert backing material 20 in Examples 1 through 4. Sheets of metal shim stock as well as plastics such as polycarbonate, polyurethane, aceytal, phenolic, polyester, poly vinyl chloride, poly vinyl acetate, etc., could all be used if they were flat and compatible with the polishing chemistry. Likewise, the G-10 used for the template 10 can be replaced by other materials such as the plastics mentioned above. Metallic materials were not as successful for the template 10 because they tended to exhibit high wear rates and their hardness often caused fracturing or chipping around the edges of the workpieces.

With respect to its effect on flatness, the most important component is the fixturing material 24. It was found that this layer is most effectively employed if it is placed in direct contact with the back side of the workpiece 26. The fixturing material of Example 4 was further improved by decreasing its density. Success was also obtained by sanding the surface of the fixturing material to expose its pores and lower the compressive modulus at its surface. Experiments conducted with a wide variety of compressible materials revealed that several properties were particularly important to their success.

Compression Set was found to be very detrimental. The ideal fixturing material should have a compression set value of zero. Since this is not possible, materials used should have as low a value as practical. Hysteresis should also be as low as possible. Materials high in hysteresis gave poorer flatness results. They may have been due to overheating or uneven heating as the material flexed under the dynamics of the polishing or lapping operation.

Compressive Modulus of the fixturing material was found to have a very strong influence on the ultimate flatness achieved. Flattest wafers were produced when the fixturing material under polishing load compressed between 10 and 60 percent of its potential range of compressibility. For this measurement, ultimate compressibility was determined by compressing the material under successively higher loads until additional loading produced no further significant volume compression. For example, one 15 mil film had an ultimate compressed thickness of 5 mils. For this film, the 10 to 60 percent range would correspond to a compression of between 1 and 6 mils respectively.

Successful materials for the fixturing material 24 were found among fine-celled blown foams and coagulated microporous films such as those developed to imitate leather. Examples of the latter are shown in the "intermediate layer" of the U.S. Pat. No. 4,021,161, and the films of U.S. Pat. Nos. 3,871,938; 4,006,052; 3,284,274; 3,492,154; 3,565,668; 3,524,791 and 3,208,875; and the like. In some films, the presence of macropores even as large as 500 microns in diameter seems to beneficially lower initial compressive modulus without degrading compression set.

The present invention may be embodied in other specific forms without departing from the spirit or essential attributes thereof and, accordingly, reference should be made to the appended claims, rather than to the foregoing specification, as indicating the scope of the invention.

I claim:

1. A workpiece holder for polishing, lapping and grinding operations comprising a carrier adapted to be mounted for rotation, a flat template secured to a face of the carrier and having a plurality of holes therethrough, each hole cooperating with said carrier face to define a discrete cavity, an insert removably retained in each cavity, each insert comprised of a volume compressible fixturing material having a low compression set value and a low compressive modulus that will allow it to compress under a service load to at least 10 percent but not more than 60 percent of its potential range of compressibility, the fixturing material being adapted to be releasably attached to a major face of a workpiece, the fixturing material being secured to the carrier by a thermoplastic resin, the resin being initially placed within each cavity with the cavity at a temperature sufficient to cause the resin to melt, the volume compressible fixturing material then being placed in each cavity over which is then pressed a blank with geometry the same as that desired from the finished workpiece, the fixturing material with the blank then being compressed at a reduced temperature, causing the melted resin first to flow and form a seat to compensate for irregularities and imperfections in the fixturing material, and then to cool and harden in said compensated condition.

2. The holder of claim 1 wherein the fixturing material has been ground prior to the attachment of the workpiece to render it flat and to open pores on its surface in order to lower its compressive modulus.

3. The holder of claim 1 wherein the resin is a Pentalyn C resin containing 20% Polypropylene Glycol.

4. The holder of claim 1 wherein the cavities are initially heated to a temperature of 150° C. prior to the placement of the resin therein.

5. The holder of claim 1 wherein the holder is cooled to a temperature of 20° C. as the inserts are being compressed.

6. The holder of claim 1 wherein the compressive force used is about the same as that seen by the workpiece during the polishing or lapping or grinding operation.

7. A workpiece holder for polishing, lapping and grinding operations comprising a carrier adapted to be mounted for rotation, a flat template secured to a face of the carrier and having a plurality of holes therethrough, each hole cooperating with said carrier face to define a discrete cavity, an insert removably retained in each cavity, each insert comprising a flat, semi-rigid backing material on one side, the backing material comprised of a dimensionally stable material secured to a volume compressible fixturing material having a low compression set value and a low compressive modulus that will allow it to compress under a service load to at least 10 percent but not more than 60 percent of its potential range of compressibility, the fixturing material being bonded to the backing material and being adapted to be releasably attached to a major face of a workpiece.

* * * * *